United States Patent
Hamada et al.

(10) Patent No.: US 9,172,063 B2
(45) Date of Patent: Oct. 27, 2015

(54) METHOD AND APPARATUS FOR MANUFACTURING DISPLAY DEVICES

(75) Inventors: Tomohide Hamada, Yokohama (JP); Kei Nara, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 305 days.

(21) Appl. No.: 12/102,509

(22) Filed: Apr. 14, 2008

(65) Prior Publication Data
US 2008/0254704 A1     Oct. 16, 2008

Related U.S. Application Data

(60) Provisional application No. 60/907,906, filed on Apr. 20, 2007.

(30) Foreign Application Priority Data

Apr. 13, 2007    (JP) ................................ 2007-105464

(51) Int. Cl.
*B05D 5/12*     (2006.01)
*H01L 51/56*    (2006.01)
(Continued)

(52) U.S. Cl.
CPC .............. *H01L 51/56* (2013.01); *G02F 1/1303* (2013.01); *H01J 9/241* (2013.01); *H01J 9/242* (2013.01); *G02F 2001/133302* (2013.01); *G02F 2001/133325* (2013.01); *H01L 27/3246* (2013.01); *H01L 51/0005* (2013.01); *H01L 51/0022* (2013.01)

(58) Field of Classification Search
USPC .................................................... 427/68, 428
See application file for complete search history.

(56) References Cited

U.S. PATENT DOCUMENTS 5,025,269 A * 6/1991 Saeki et al. .................... 347/116
5,906,156 A * 5/1999 Shibuya et al. ............. 101/93.12
(Continued)

FOREIGN PATENT DOCUMENTS

JP    2000-162640    6/2000
JP    2002-367523    12/2002
(Continued)

OTHER PUBLICATIONS

English translation of the Written Opinion of the International Searching Authority for International Application No. PCT/2008/000695.
(Continued)

*Primary Examiner* — Austin Murata
(74) *Attorney, Agent, or Firm* — Mori & Ward, LLP

(57) ABSTRACT

A method for fabricating a display device including forming a standard mark in a flexible substrate fed in a first direction, forming a partition wall in the flexible substrate, and forming an electrode by applying a conductive member at a predetermined position between the partition walls by an applicator based on the standard mark. An apparatus is provided that includes a transportation unit to transport a flexible substrate in a first direction, a mark formation unit to form a standard mark in the flexible substrate, a partition wall formation unit to form a partition wall in the flexible substrate, and an application unit to apply a conductive member to a predetermined position between the partition walls based on the standard mark. A display device is provided that includes a flexible substrate, a partition wall formed by pressing the flexible substrate, and an electrode formed by application between the partition walls.

12 Claims, 11 Drawing Sheets

(51) Int. Cl.
*G02F 1/13* (2006.01)
*H01J 9/24* (2006.01)
*G02F 1/1333* (2006.01)
*H01L 27/32* (2006.01)
*H01L 51/00* (2006.01)

(56) References Cited

U.S. PATENT DOCUMENTS

| | | | |
|---|---|---|---|
| 5,929,961 A | 7/1999 | Nishi et al. | |
| 6,413,790 B1* | 7/2002 | Duthaler et al. | 438/21 |
| 2002/0089477 A1* | 7/2002 | Kanbe et al. | 345/87 |
| 2002/0145380 A1* | 10/2002 | Aziz et al. | 313/504 |
| 2002/0195928 A1* | 12/2002 | Grace et al. | 313/503 |
| 2003/0101885 A1* | 6/2003 | Jordan et al. | 101/395 |
| 2003/0107212 A1 | 6/2003 | Kerr et al. | |
| 2003/0224262 A1* | 12/2003 | Lof et al. | 430/22 |
| 2004/0109128 A1* | 6/2004 | Hirabayashi | 349/187 |
| 2004/0142273 A1 | 7/2004 | Nishida et al. | |
| 2004/0170762 A1* | 9/2004 | Newsome et al. | 427/256 |
| 2004/0235227 A1* | 11/2004 | Kawase | 438/158 |
| 2005/0196969 A1* | 9/2005 | Gunner et al. | 438/725 |
| 2006/0055314 A1 | 3/2006 | Nakamura et al. | |
| 2006/0110545 A1 | 5/2006 | Toyoda | |
| 2006/0145146 A1 | 7/2006 | Suh et al. | |
| 2006/0279679 A1 | 12/2006 | Fujisawa et al. | |
| 2007/0157873 A1* | 7/2007 | Hauptmann et al. | 117/87 |
| 2009/0039772 A1* | 2/2009 | Takashima et al. | 313/504 |

FOREIGN PATENT DOCUMENTS

| | | |
|---|---|---|
| JP | 2005-502987 | 1/2005 |
| JP | 2006-106106 | 4/2006 |
| JP | 2006-156426 | 6/2006 |
| JP | 2006-163418 | 6/2006 |
| JP | 2006-294485 | 10/2006 |
| JP | 2007-033537 | 2/2007 |
| JP | 2007-059188 | 3/2007 |
| WO | WO 03/001490 | 1/2003 |
| WO | WO 2007/004627 * | 1/2007 |

OTHER PUBLICATIONS

Chinese Office Action for corresponding CN Application No. 200880011676.3, Oct. 13, 2010.
Japanese Office Action for corresponding JP Application No. 2009-510771, Jul. 23, 2012.
European Office Action for corresponding EP Application No. 08 720 574.6-1555, Mar. 19, 2013.
Japanese Office Action for corresponding JP Application No. 2012-201224, Aug. 5, 2013.
Korean Office Action for corresponding KR Application No. 10-2014-7017977, Oct. 5, 2014.
Korean Office Action for corresponding KR Application No. 10-2009-7023597, Mar. 30, 2014.
Taiwanese Office Action for corresponding TW Application No. 10-2009-7023597, Mar. 30, 2014.
European Office Action for corresponding EP Application No. 08 720 574.6-1555, Nov. 28, 2014.

* cited by examiner

FIG. 3 (a-1)
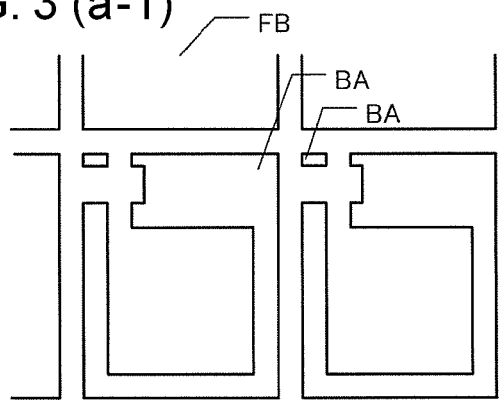
FIG. 3 (a-2)
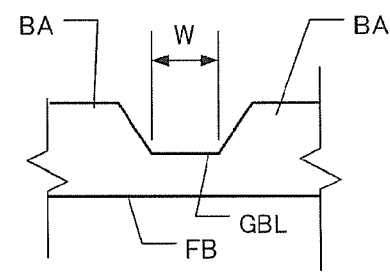
FIG. 3 (b-1)
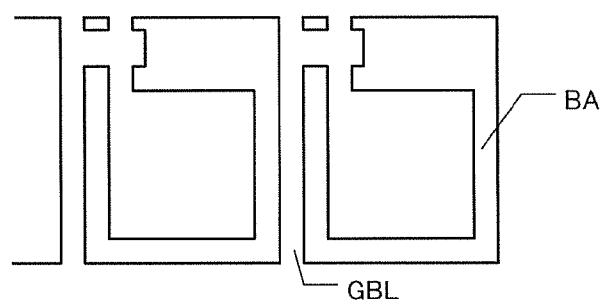
FIG. 3 (b-2)
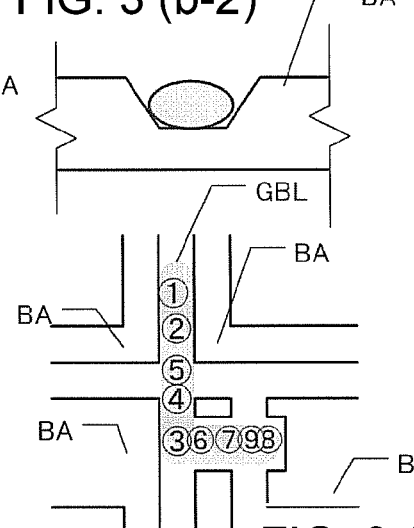
FIG. 3 (b-3)
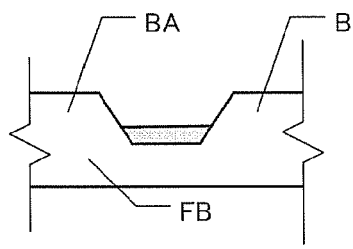
FIG. 3 (b-4)

METHOD AND APPARATUS FOR MANUFACTURING DISPLAY DEVICES

CROSS-REFERENCE TO RELATED APPLICATION

The present application claims priority to Japanese Patent Application No. 2007-105464, filed Apr. 13, 2007 and U.S. Provisional Application No. 60/907,906, filed on Apr. 20, 2007. The contents of these applications are incorporated herein by reference in their entirety.

BACKGROUND OF THE INVENTION

1. Field of the Invention

The present invention relates to a flat panel display device such as an organic electroluminescence device, a liquid crystal display device, or a field emission display (FED). Further, the present invention relates to a fabrication method and apparatus of the display device.

2. Discussion of the Background

Display devices such as liquid crystal display devices have been widely employed for various kinds of electronic appliances due to characteristics of such devices, such as compact size, thin shape, low electric power consumption, and lightweight design. Driving circuits or thin film transistors used for driving liquid crystal display devices are generally fabricated using an exposure apparatus, or so-called stepper.

It has been proposed to develop liquid crystal display devices that are large in size; however, after the eighth generation of such display devices of increasing size, the size growth reaches towards an ultimate extent that no technique can deal with further size growth requirements along conventional scale-up techniques in terms of the fabrication cost, apparatus transportation restrictions, and the like. Thus, there are many challenging problems facing a further increase in the size of such liquid crystal display devices. Further, in order to save fabrication costs, in addition to improvements in the efficiency by size growth of substrates, there are problems of reduction in cost of apparatuses, reduction in running costs, and improvements of yield of large scale panels.

Furthermore, recently manufacturers have now begun to market organic electroluminescence (EL) and field emission displays, and, with respect to the fabrication of such next generation display devices, reduction in the cost of the apparatus and reduction in the running cost are also challenging problems.

U.S. Pat. No. 5,929,961 (Japanese Patent No. 3698749) describes a method for fabricating liquid crystal display devices in a rolling manner as a countermeasure for saving apparatus costs and running costs for fabricating liquid crystal display devices. In examples described in U.S. Pat. No. 5,929,961 (Japanese Patent No. 3698749), a method for easily fabricating passive type liquid crystal cells is described; however, as will be discussed below, the method is not for fabricating a display system having a high-precision driving circuit or thin film transistor, which is presently used, and therefore a need exists for improvement of such methods.

SUMMARY OF THE INVENTION

According to one aspect of the present invention, a method for fabricating a display device is provided that includes forming standard marks in a flexible substrate fed in a first direction, forming partition walls in the flexible substrate, and forming electrodes by applying a conductive member at a predetermined position between the partition walls by an applicator based on the standard mark.

According to another aspect of the present invention, an apparatus for fabricating a display device is provided that includes a transportation unit configured to transport a flexible substrate in a first direction, a mark formation unit configured to form standard marks in the flexible substrate, a partition wall formation unit configured to form partition walls in the flexible substrate, and an application unit configured to apply a conductive member to a predetermined position between the partition wall based on the standard mark.

According to yet another aspect of the present invention, a display device is provided that includes a flexible substrate, partition walls formed by pressing the flexible substrate, and an electrode formed by application between the partition walls.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 3(a-1) is a top view showing a state in which a sheet substrate FB is pressed by an imprint roller 10 (see FIG. 2) and partition walls BA is formed;

FIG. 3(a-2) is a cross-sectional view of a gate bus line GBL;

FIG. 3(b-1) is a top view of the sheet substrate FB in which a gate electrode is formed;

FIG. 3(b-2) is a cross-sectional view showing a state in which metal ink is put in the partition wall BA for gate bus line GBL;

FIG. 3(b-3) shows, using reference the numerals ① to ⑨, an order of application of the metal ink;

FIG. 3(b-4) shows the metal ink forming as a thin film;

FIG. 10(a) shows a printing roller 40p in which a roller center is expanded or dented in a pneumatic or hydraulic control manner, FIG. 10(b) shows a printing roller 40q that is expanded or contracted as a whole in a thermal deformation control manner, and FIG. 10(c) shows a printing roller 40r that is curved as a whole in a bending deformation control manner.

DETAILED DESCRIPTION OF EMBODIMENTS OF THE INVENTION

Figure 1A:
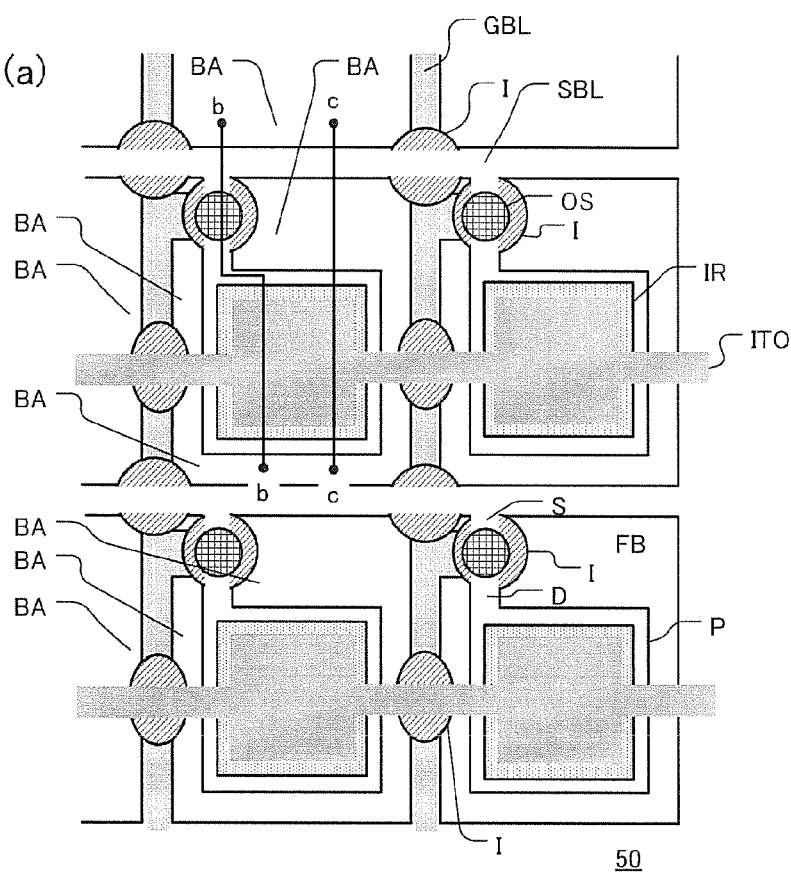
FIG. 1(a) is a top view of an organic electroluminescence (EL) device 50.

Embodiments of the present invention will be described hereinafter with reference to the accompanying drawings. In the following description, the constituent elements having substantially the same function and arrangement are denoted by the same reference numerals, and repetitive descriptions will be made only when necessary.

As noted above, in examples described in U.S. Pat. No. 5,929,961 (Japanese Patent No. 3698749), a method for easily fabricating passive type liquid crystal cells is described; however, the method is not for fabricating a display system having a high-precision driving circuit or thin film transistor, which is presently used. The inventors have noted that it is very important to carry out positioning for formation of the high-precision driving circuit or thin film transistor, and therefore a need exists for improvement of such methods.

Therefore, the present invention provides embodiments of a fabrication apparatus and a method, in which a high-precision driving circuit or thin film transistor is formed in a flexible substrate, and can be used to form a display device with mass productivity.

According to an aspect of the invention, a method of fabricating a display device is provided that includes forming a standard mark in a flexible substrate fed in a first direction, forming a partition wall in the flexible substrate, and forming an electrode by applying a conductive member at a predetermined position against the partition wall by an applicator based on the standard mark.

Such a fabrication method allows for the formation of a standard mark and a partition wall in a flexible substrate and the formation of an electrode by applying a conductive member. Accordingly, a thin film transistor, and the like, can be formed with high precision at low cost.

According to another aspect of the invention, an apparatus for fabricating a display device is provided that includes a transportation unit for transporting a flexible substrate in a first direction, a mark formation unit for forming a standard mark in the flexible substrate, a partition wall formation unit for forming partition walls in the flexible substrate, and an application unit for applying a conductive member to a predetermined position between the partition wall based on the standard mark.

Such a fabrication apparatus allows for the formation of a standard mark and a partition wall in a flexible substrate and the application of a conductive member with high precision based on the standard mark. A partition wall means the side wall of a depression, a bump or a step formed on the surface of a flexible substrate.

According to a further aspect of the invention, a display device is provided that includes a flexible substrate, partition walls formed by pressing the flexible substrate, and an electrodes formed by application between partition walls.

A large number of display devices each having an electrode applied between partition walls formed by pressing a flexible substrate can be produced with high precision at low cost.

Embodiments of the invention provide display device fabrication methods, apparatuses, and display devices that are greatly advantageous in reduction in cost of the apparatus, reduction in running cost, and reduction in cost of the display device itself. Furthermore, embodiments of the invention provide display devices that can advantageously be formed with high precision using a partition wall.

Embodiments of the invention can provide a completed panel that is transportable in a roll-like shape, and thus the transportation cost can be remarkably saved. In particular, the effect becomes more significant as the panel is a higher polyhedral panel or larger panel.

Embodiments of the invention described below provide a display device fabrication apparatus that is an apparatus applicable for an organic EL device, a liquid crystal display device, or a field emission display. At first, the structure of the organic EL device will be described and a fabrication apparatus and a fabrication method of the organic EL device will be described in Embodiments 1 and 2, and, successively, a liquid crystal fabrication apparatus will be described in Embodiment 3.

Figure 1B:
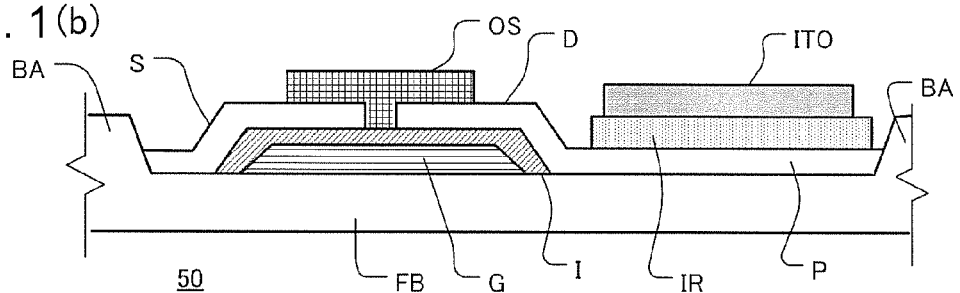
FIGS. 1(b) and 1(c) are partial, cross-sectional views taken along lines b-b and c-c, respectively, in FIG. 1(a)
Figure 1C:
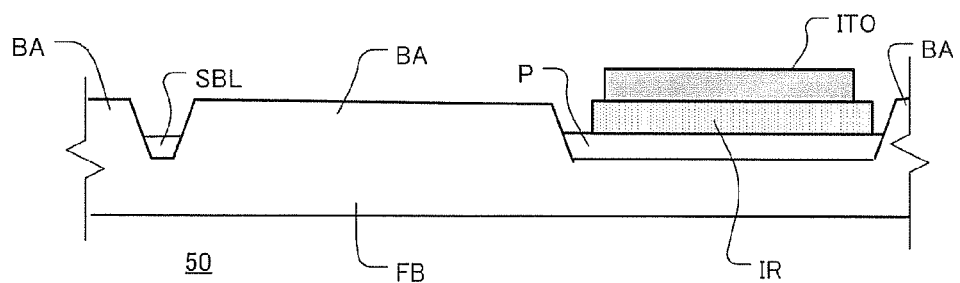

FIG. 1(a) is a top view of an organic electroluminescence (EL) device 50 of a field effect transistor, and FIGS. 1(b) and 1(c) are partial, cross-sectional views taken along lines b-b and c-c, respectively, in FIG. 1(a). The organic EL device 50 is a bottom contact type fabricated by forming a gate electrode G and a gate insulating layer I on a flexible sheet substrate FB, further forming a source electrode S, a drain electrode D, and a pixel electrode P and thereafter forming an organic semiconductor layer OS.

As shown in FIG. 1(b), the gate electrode G is formed. The insulating layer I is formed on the gate electrode G. The source electrode S of a source bus line SBL is formed on the insulating layer I, and, at the same time, the drain electrode D connected to the pixel electrode P is formed. The organic semiconductor layer OS is formed between the source electrode S and the drain electrode D. In this way, a field effect transistor is completed. Further, as shown in FIGS. 1(b) and 1(c), a light emitting layer IR is formed on the pixel electrode P and a transparent electrode ITO is formed on the light emitting layer IR.

As can be understood from a review of FIGS. 1(b) and 1(c), a partition wall BA (bank layers) is formed in the sheet substrate FB. As shown in FIG. 1(c), the source bus line SBL is formed between the partition walls BA. As described above, presence of the partition wall BA makes formation of the source bus line SBL with high precision and also formation of the pixel electrode P and light emitting layer IR accurately. Although not being illustrated in FIGS. 1(b) and 1(c), a gate bus line GBL is formed between the partition walls BA similarly to the source bus line SBL. A fabrication apparatus for fabricating such an organic EL device 50 by mass production will be described below.

Embodiment 1

Fabrication Apparatus of Organic EL Device

Figure 2:
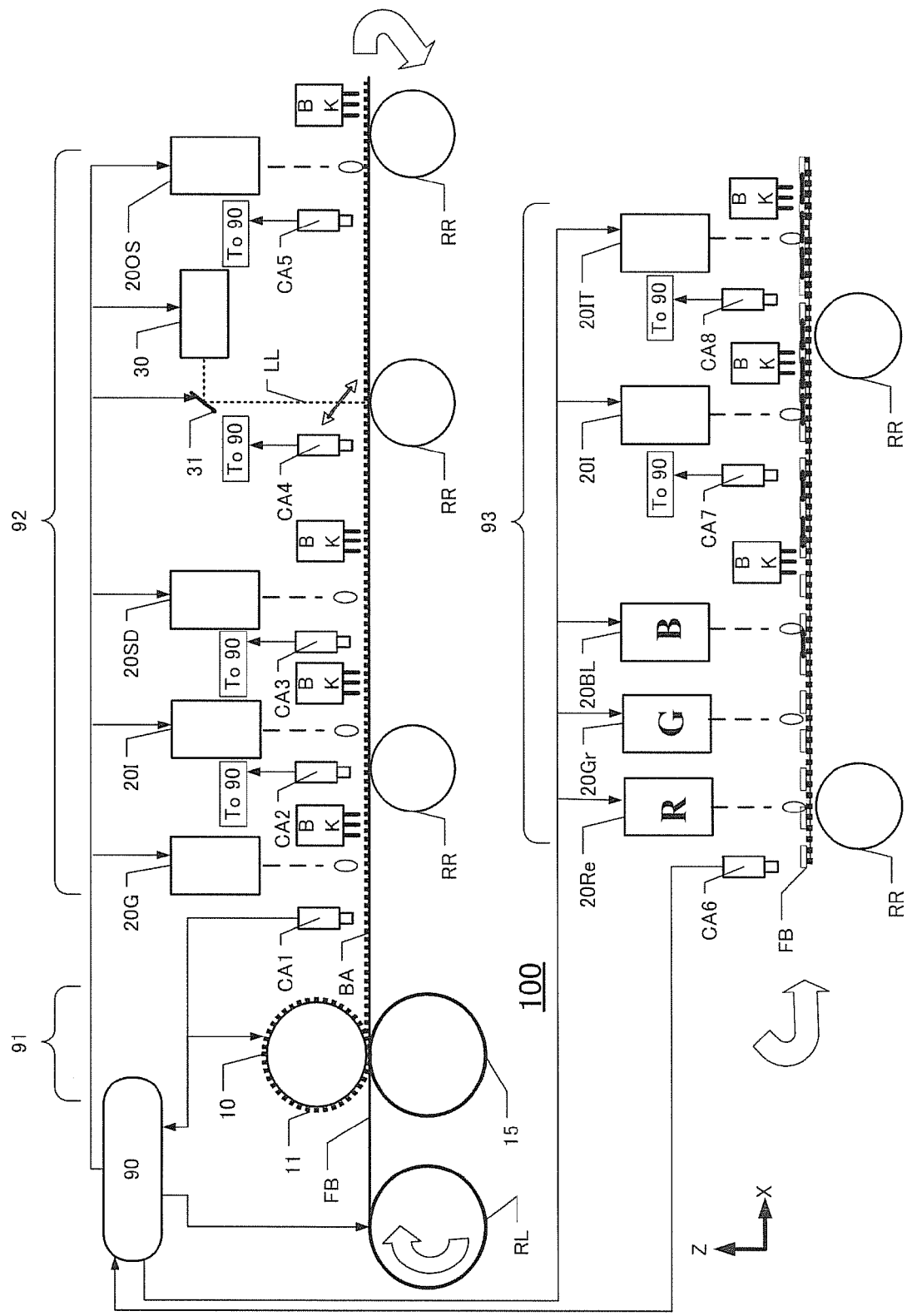
FIG. 2 is a schematic view showing a configuration of a fabrication apparatus 100 for fabricating the organic EL device having a pixel electrode and a light emitting layer in a flexible sheet substrate.

FIG. 2 is a schematic view showing a configuration of a fabrication apparatus 100 for fabricating the organic EL device 50 having the pixel electrode P and the light emitting layer IR, shown in FIG. 1(*a*)-(*c*), in the flexible sheet substrate FB.

The fabrication apparatus 100 of the organic EL device 50 of this embodiment form the sheet substrate FB in which a thin film transistor (TFT) and the pixel electrode P are formed. Further, the apparatus forms the partition wall BA in a boundary area of the pixel electrode P easily with high precision in order to precisely form one or more organic compound layers (light emitting device layers) having the light emitting layer IR on the pixel electrode P on the sheet substrate FB.

The fabrication apparatus 100 for organic EL devices is equipped with a supply roll RL for feeding a strip-shaped flexible sheet substrate FB rolled into a roll. The supply roll RL rotates at a predetermined speed to feed the sheet substrate FB in an X-axial direction, which is a transportation direction. Further, the fabrication apparatus 100 for organic EL devices is further equipped with rollers RR at a plurality of points and the rollers RR also rotate to feed the sheet substrate FB in the X-axial direction. The roller RR can be a rubber roller sandwiching the sheet substrate FB from both sides or can be a ratchet-bearing roller RR if the sheet substrate FB has perforations. Some of these rollers RR are movable in a Y-axial direction perpendicular to the transportation direction.

The fabrication apparatus 100 for organic EL devices can be provided with a cutter, which is not illustrated, for cutting the sheet substrate FB in a predetermined size in the final process. Further, the apparatus can be provided with a winding-up roll, which is not illustrated, for winding up the sheet substrate FB into a roll. The cutter or a winding-up roll cuts or winds up the sheet substrate FB at a predetermined speed synchronously with the supply roll RL and rollers RR.

The sheet substrate FB fed from the supply roll RL at first comes to a partition wall formation step 91 of forming the partition wall BA in the sheet substrate FB. In the partition wall formation step 91, the sheet substrate FB is pressed by an imprint roller 10 and heated to a glass transition temperature or higher by a heat transfer roller 15 so as to keep the shape of the press-formed partition wall BA. Therefore, the molding shape formed on the roller surface of the imprint roller 10 is transferred to the sheet substrate FB.

The roller surface of the imprint roller 10 is mirror-finished and a mold 11 for fine imprinting made of a material such as SiC, or Ta, is attached to the roller surface. The mold 11 for fine imprinting has a stumper for wining of the thin film transistor, or the like. Further, in order to form an alignment mark AM in both sides in the Y-axial direction, which is the width direction of the strip-shaped flexible sheet substrate FB, the mold 11 for fine imprinting is a stumper for alignment mark AM.

The sheet substrate FB is moved further in the X-axial direction and comes to an electrode formation step 92. In the electrode formation step 92, a thin film transistor using an organic semiconductor is formed. If the thin film transistor is configured using the organic semiconductor, a thin film transistor can be formed by employing a printing technique or droplet application technique. Among thin film transistors using organic semiconductors is the field effect transistor (FET) as shown in FIGS. 1(*a*)-(*c*) particularly preferable.

In the electrode formation step 92, a droplet applicator 20G for gates, a droplet applicator 20I for insulating layers, a droplet applicator 20, and the like, are used. Hereinafter, a droplet applicator 20SD for sources and drains as well as pixel electrodes, an organic semiconductor droplet applicator 20OS, a droplet applicator 20IT for ITO electrodes, and the like, are employed, however, any ink jet type or dispenser type can be employed and they can be collectively called as a droplet applicator 20.

Examples of the ink jet type include a charge control type, a pressure vibration type, an electromechanical conversion type, a thermoelectric conversion type, an electrostatic attraction type, and the like. A droplet application method is capable of properly arranging a desired amount of a material at a desired position with no vain use of the material. The amount of one droplet of metal ink, or the like, to be applied by the droplet application method is, for example, 1 to 300 ng.

At first, the droplet applicator 20G for gates applies metal ink into the partition wall BA of the gate bus line GBL. The metal ink is dried or baked by radiation heat such as hot air or far infrared rays with a heat treater BK. A gate electrode G is formed by these treatments. The metal ink is a liquid containing a conductor having a particle diameter of about 5 nm dispersed stably in a solvent at room temperature. Carbon, silver (Ag) or gold (Au) can be used as the conductor.

Next, the droplet applicator 20I for insulating layers applies electrically insulating ink containing a polyimide-based resin or a urethane-based resin to a switching part. The electrically insulating ink is dried and cured by heat radiation such as hot air or far infrared rays with the heat treater BK. The gate insulating layer I is formed by these treatments.

Next, the droplet applicator 20SD for sources and drains as well as pixel electrodes applies metal ink into the partition wall BA of the source bus line SBL and the partition wall BA of the pixel electrode P. The metal ink is dried or baked with the heat treater BK. An electrode, in which the source electrode S, the drain electrode D, and the pixel electrode P are connected, formed by these treatments.

Next, the mutually connected source electrode S and drain electrode D are cut by a cutter 30. The cutter 30 is preferably a laser with a wavelength absorbed by a metal film to be cut and can be a wavelength-variable laser with a double, triple, or quadruple higher harmonic such as YAG. Further, heat diffusion can be prevented by using a pulse type laser and damages other than the cutting part can be suppressed. In the case where the material is aluminum, a femtosecond laser with a wavelength of 760 nm is preferable. A femtosecond laser radiation unit using a titanium sapphire laser radiates laser light LL at a pulse of 10 KHz to 40 KHz. The radiation position of the laser light LL can be changed by rotation of a galvanomirror 31 positioned on the optical path of laser light LL.

The cutter 30 is capable of carrying out processing in a sub-micron order since the femtosecond laser is used, and accurately cuts the interval (channel length) of the source electrode S and the drain electrode D which determines the capability of the field effect type transistor. The interval of the source electrode S and the drain electrode D is about 3 μm to 30 μm. The source electrode S and the drain electrode D divided each other can be formed by this cutting treatment.

Other than the femtosecond laser, a carbonate gas laser or a green laser can be used for laser light LL. Besides lasers, mechanical cutting using a dicing saw can be employed.

Next, the organic semiconductor droplet applicator 20OS applies organic semiconductor ink to the switching unit between the source electrode S and the drain electrode D in the channel length. The organic semiconductor ink is dried or baked by heat radiation such as hot air or far infrared rays with the heat treater BK. The organic semiconductor layer OS is formed by these treatments.

A compound forming the organic semiconductor ink can be a single crystal material or an amorphous material, or it can have a low molecular weight or a high molecular weight.

Particularly preferable is a single crystal of a condensed-ring aromatic hydrocarbon compound, as typified by anthracene, or the like, or π-conjugated polymers.

In the above-mentioned manner, without employing a so-called photolithographic process, a thin film transistor, or the like, can be formed by utilizing a printing technique and droplet application technique. Only the printing technique or droplet application technique by itself cannot fabricate a thin film transistor, or the like, with high precision due to bleeding or spreading of ink. However, since the partition wall BA is formed in the partition wall formation step 91, the bleeding or spreading of ink can be prevented. Further, the interval between the source electrode S and the drain electrode D, which determines the capability of the thin film transistor, can be formed by laser processing or mechanical processing.

The fabrication apparatus 100 for organic EL devices successively carried out a step of forming the light emitting layer IR of the organic EL device on the pixel electrode P. In a light emitting layer formation step 93, the droplet applicator 20 for light emitting layers (a droplet applicator 20Re for red emitting layers, a droplet applicator 20Gr for green emitting layers, and a droplet applicator 20BL for blue emitting layers) can be used.

The light emitting layer IR contains a host compound and a phosphorescent compound (referred to also as a phosphorescence-emitting compound). The host compound is a compound contained in the light emitting layer IR. The phosphorescent compound is a compound, in which light emission from a triplet excitation state can be observed, and emits phosphorescent emission at room temperature.

The droplet applicator 20Re for red emitting layers applies an R solution to the pixel electrode P and carries out film formation with a thickness of 100 nm in a dried state. The R solution is a solution obtained by dissolving a red dopant material and polyvinyl carbazole (PVK) as a host material in 1,2-dichloroethane.

Successively, the droplet applicator 20Gr for green emitting layers applies a G solution to the pixel electrode P. The G solution is a solution obtained by dissolving PVK as a host material and a green dopant material in 1,2-dichloroethane.

Further, the droplet applicator 20BL for blue emitting layers applies a B solution to the pixel electrode P. The B solution is a solution obtained by dissolving PVK as a host material and a blue dopant material in 1,2-dichloroethane.

Thereafter, the light emitting layer solutions are dried and cured by radiation heat such as hot air or far infrared rays with the heat treater BK.

Next, the droplet applicator 20I for insulating layers applies electrically insulating ink containing a polyimide-based resin or a urethane-based resin to a portion of the gate bus line GBL or the source bus line SBL in a manner of preventing short circuiting with the transparent electrode ITO, which will be described later. The electrically insulating ink is then dried and cured by radiation heat such as hot air or far infrared rays with the heat treater BK.

Thereafter, the droplet applicator 20IT for ITO electrodes applies ITO (indium tin oxide) ink on the red-, green-, and blue-emitting layers. The ITO ink is a compound obtained by adding tin oxide ($SnO_2$) in several % to indium oxide ($In_2O_3$) and the electrode is transparent. Further, amorphous materials such as IDIXO ($In_2O_3$—ZnO) suitable for forming transparent electrode film layers can be used. The transparent conductive film preferably has a light transmittance of 90% or higher. Thereafter, the ITO ink is dried and cured by radiation heat such as hot air or far infrared rays with the heat treater BK.

Although the partition wall formation step 91 to the light emitting layer formation step 93 are continuously carried out for the fabrication, the sheet substrate FB can be wound up by a winding-up roll after once the steps are finished between the partition wall formation step 91 and the electrode formation step 92. In the case where once winding-up is carried out, in order to protect the formed electrode, it is preferable to carry out the winding-up together with mating paper, which is a cushion layer, at the time of winding-up The fabrication apparatus 100 for organic EL devices described with reference to FIG. 2 can fabricate the organic EL device 50 shown in FIGS. 1(a)-(c) and a hole transportation layer and an electron transportation layer can further be formed in the organic EL device in some cases. These layers are also formed by employing the printing technique and droplet application technique and steps for forming them can be added to the fabrication apparatus 100.

The following is a description of various states of organic EL device 50 during stages in fabrication process.

FIG. 3(a-1) is a top view showing the partition wall formation step 91, that is, the state in which the sheet substrate FB is pressed by the imprint roller 10 and the partition wall BA is formed. FIG. 3(a-2) is a cross-sectional view of the gate bus line GBL between the partition walls BA of FIG. 3(a-1). The gate bus line GBL shown in the drawing is not coated with metal ink. In FIG. 3(a-2), the cross-sectional view of the partition wall BA can be V-shape or U-shape or rectangular. However, since the sheet substrate FB is separated easily after the mold 11 for fine imprinting presses the sheet substrate FB, V-shape or U-shape is preferable.

The width W (μm) between the partition walls BA is the needed line width of the gate bus line GBL and the droplet diameter d (μm) applied from the droplet applicator 20G for gates shown in FIG. 2 is preferably about W/2 to W/4.

FIG. 3(b-1) is a top view of the sheet substrate FB in which the gate electrode G is formed in the electrode formation step 92. FIG. 3(b-2) is a cross-sectional view showing the state in which the metal ink is put in the partition wall BA for gate bus line GBL. The application order is controlled as shown in the plane view of FIG. 3(b-3) in a manner that the gate electrode G becomes linear. The reference numerals ① to ⑨ in FIG. 3(b-3) show the application order. It is the order for application of droplets to make metal ink linear by liquid tension. Basically, the metal ink is applied in a manner that the middle part is applied last.

When the metal ink is dried or baked by the heat treater BK, the metal ink forms a thin film (drawn in magnified manner in the drawing) as shown in the cross-sectional view of FIG. 3(b-4). Formation of the partition wall BA prevents the metal ink from leaking out of the gate bus line GBL when the metal ink is applied by the droplet applicator 20 and further dried or baked with the heat treater BK.

Figure 4A:
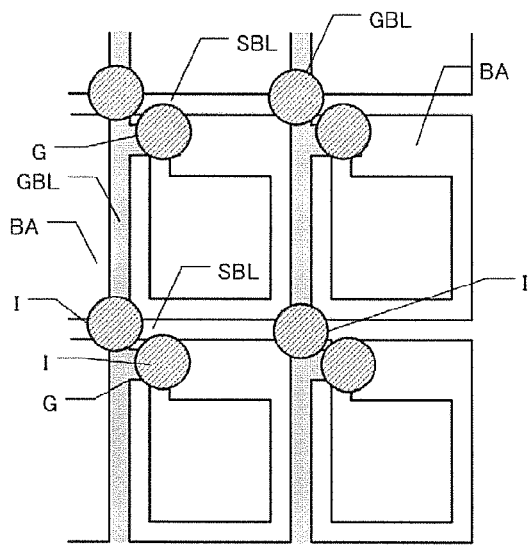
FIG. 4(a) is a plan view showing a state in which an insulating layer I is formed by droplet applicator 201 (see FIG. 2) for insulating layers.
Figure 4:
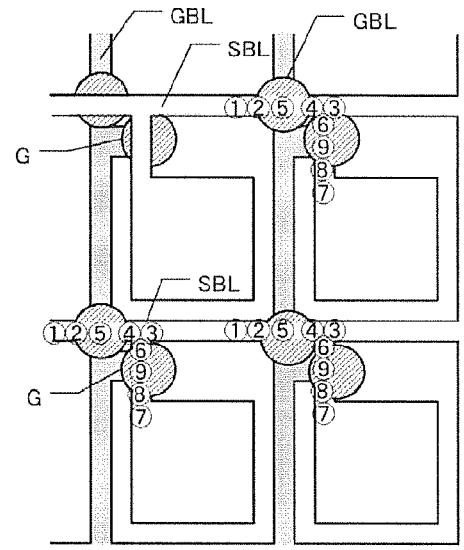
FIG. 4(b) is a plan view showing a state in which the source bus line SBL is formed.
FIG. 4(c) is a plan view showing a state in which an interval between a source electrode S and a drain electrode D is cut by a cutter 30 (see FIG. 2)
FIG. 4(d) is a plan view showing a state in which organic conductive ink is applied between the source electrode S and the drain electrode D by an organic semiconductor droplet applicator 200S (see FIG. 2)

FIG. 4(a) is a plan view showing the state in which the insulating layer I is formed by the droplet applicator 20I for insulating layers in the electrode formation step 92. In the drawing, the insulating layer I is drawn circularly over the partition wall BA for easy understanding, however it is no need for the layer to be over the partition wall BA and electrically insulating ink can be applied to the gate electrode G through which the source bus line SBL passes.

FIG. 4(b) is a plan view showing the state in which the source bus line SBL is formed in the electrode formation step 92. The reference numerals ① to ⑨ in FIG. 4(b) show the application order by the droplet applicator 20SD for sources and drains as well as pixel electrodes.

Figure 4C:
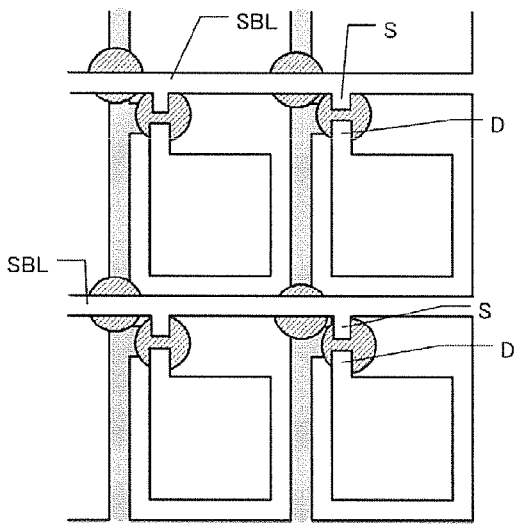
Figure 4:
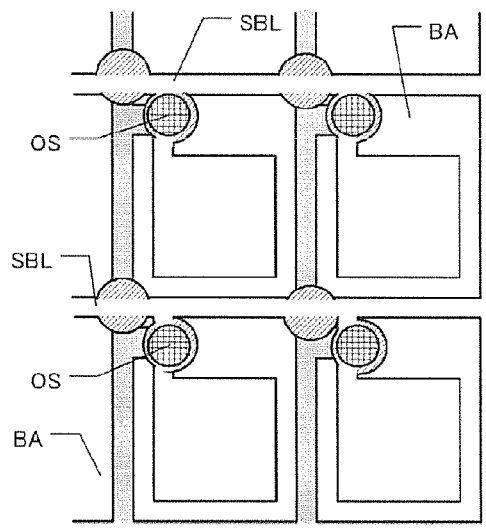

FIG. 4(c) is a plan view showing the state in which the interval between the source electrode S and the drain electrode D is cut by the cutter 30.

FIG. 4(d) is a plan view showing the state in which the organic semiconductor layer OS is formed by applying organic conductive ink between the source electrode S and the drain electrode D by the organic semiconductor droplet applicator 200S. Accordingly, the field effect type transistor is completed.

Thereafter, the light emitting layer IR and transparent electrode ITO are formed by application with the respective droplet applicators 20 to complete the organic EL device 50 shown in FIGS. 1(a)-(c). Presence of the partition wall BA prevents color mixture due to overflow of the solution to neighboring pixel areas even in the case where red-, green-, and blue-emitting layers are continuously applied by the heat treater BK without heat treatment.

Figure 5:
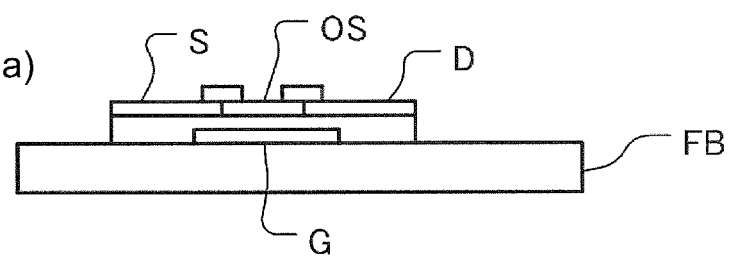
FIG. 5(a) is a cross-sectional view showing a bottom gate type of field effect type transistor.
FIG. 5(b) is a cross-sectional view showing a top gate type of field effect type transistor.
Figure 5:
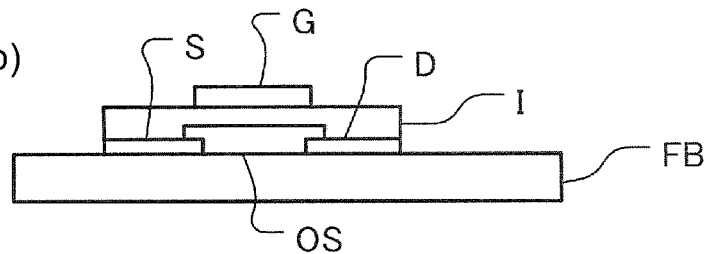

FIGS. 5(a) and 5(b) are cross-sectional views showing field effect type transistor with other configurations.

It is possible to fabricate a bottom gate type as a field effect type transistor shown in FIG. 5(a) besides the field effect type transistor shown in FIGS. 1(a)-(c). The field effect type transistor is fabricated by forming the gate electrode G, the gate insulating layer I and the organic semiconductor layer OS on the sheet substrate FB and thereafter forming the source electrode S and the drain electrode D.

FIG. 5(b) is a top gate type field effect type transistor which is fabricated by forming the source electrode S and the drain electrode D on the sheet substrate FB and thereafter forming the organic semiconductor layer OS and further forming the gate insulating layer I and the gate electrode G.

The fabrication apparatus 100, in which the order of the application of metal ink or the like is changed according to the layering order, can be used for any the field effect type transistor.

The alignment of the fabrication apparatus 100 for organic EL devices will be described.

The fabrication apparatus 100 for organic EL devices comprises a speed and alignment control unit 90 shown in FIG. 2. The speed and alignment control unit 90 controls the speed of the supply roll RL and the roller RR. The roller RR is made movable in the Y-axial direction and the speed and alignment control unit 90 controls the movement of the roller RR in the Y-axial direction. Further, the speed and alignment control unit 90 receives the detection results of the alignment marks AM from a plurality of alignment cameras CA and controls the application position and timing of ink, or the like, by the droplet applicator 20 and cutting position and timing by the cutter 30.

The alignment mark AM is formed on the sheet substrate FB by the mold 11 for fine imprinting of the imprint roller 10 shown in FIG. 2. The alignment cameras CA take images by CCD or CMOS under visible light radiation and the taken images are processed to detect the position of the alignment mark AM or laser light is radiated to the alignment mark AM and the scattered light is received to detect the alignment mark AM.

The sheet substrate FB is a heat resistant resin film and practically usable are those having a light transmitting function among a polyethylene resin, polypropylene resin, polyester resin, ethylene vinyl copolymer resin, polyvinyl chloride resin, cellulose resin, polyamide resin, polyimide resin, polycarbonate resin, polystyrene resin, and vinyl acetate resin.

As described above, the sheet substrate FB is subjected to heat treatment of thermal transfer in the partition wall formation step 91 and since the respective types of ink have to be dried or baked with the heat treater BK, the substrate is to be heated at around 200° C. The sheet substrate FB preferably has a low thermal expansion coefficient to rarely cause size difference even if it receives heat. For example, an inorganic filler can be mixed to the resin film to keep the thermal expansion coefficient low. Examples of the inorganic filler include titanium oxide, zinc oxide, alumina, silicon oxide, and the like.

However, the sheet substrate FB is expanded or contracted in the X-axial direction and Y-axial direction while passing through the heat transfer roller 15 and the heat treater BK. The fabrication apparatus 100 for organic EL devices comprises an alignment camera CA1 downstream of the heat transfer roller 15 and an alignment camera CA2 to an alignment camera CA8 behind the heat treater BK. The application position and timing of the ink, or the like, by the droplet applicator 20 and the cutting position and timing of the cutter 30 can be precisely detected by using them.

Figure 6:
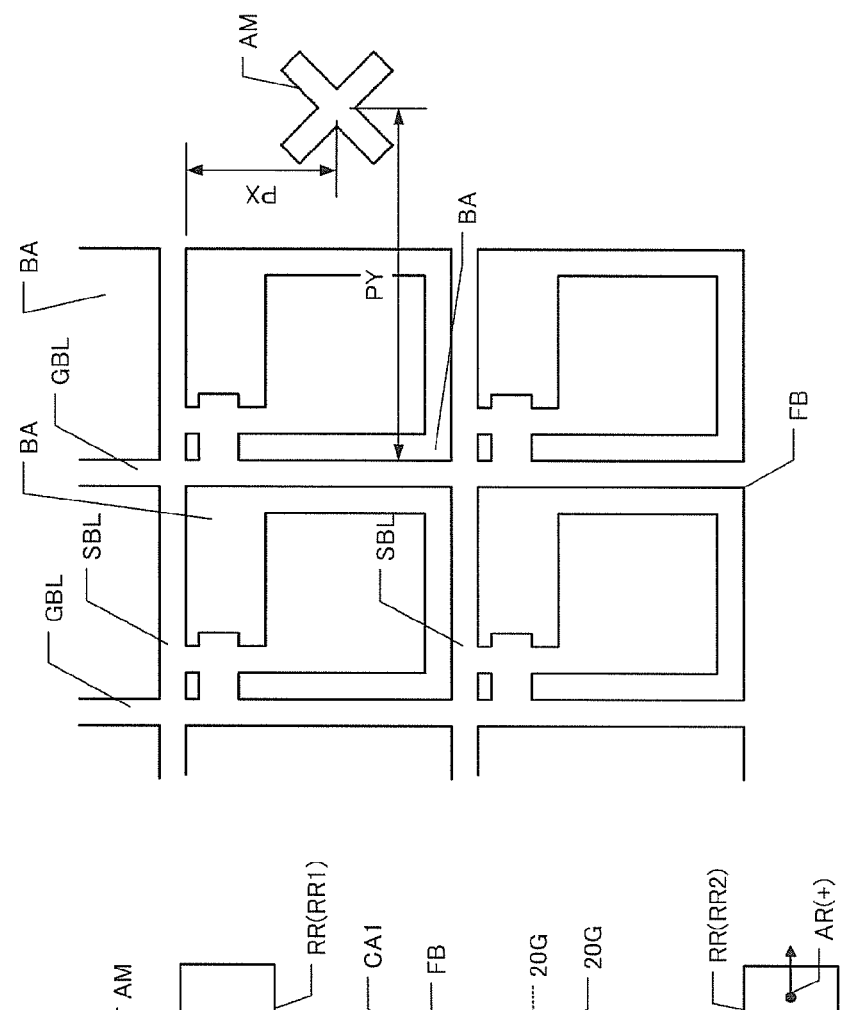
FIG. 6(a) is a top view of the fabrication apparatus 100 for organic EL devices show in an electrode formation step 92 (see FIG. 2)
FIG. 6(b) is a magnified drawing of peripheries of alignment marks AM of FIG. 6(a)
Figure 6:
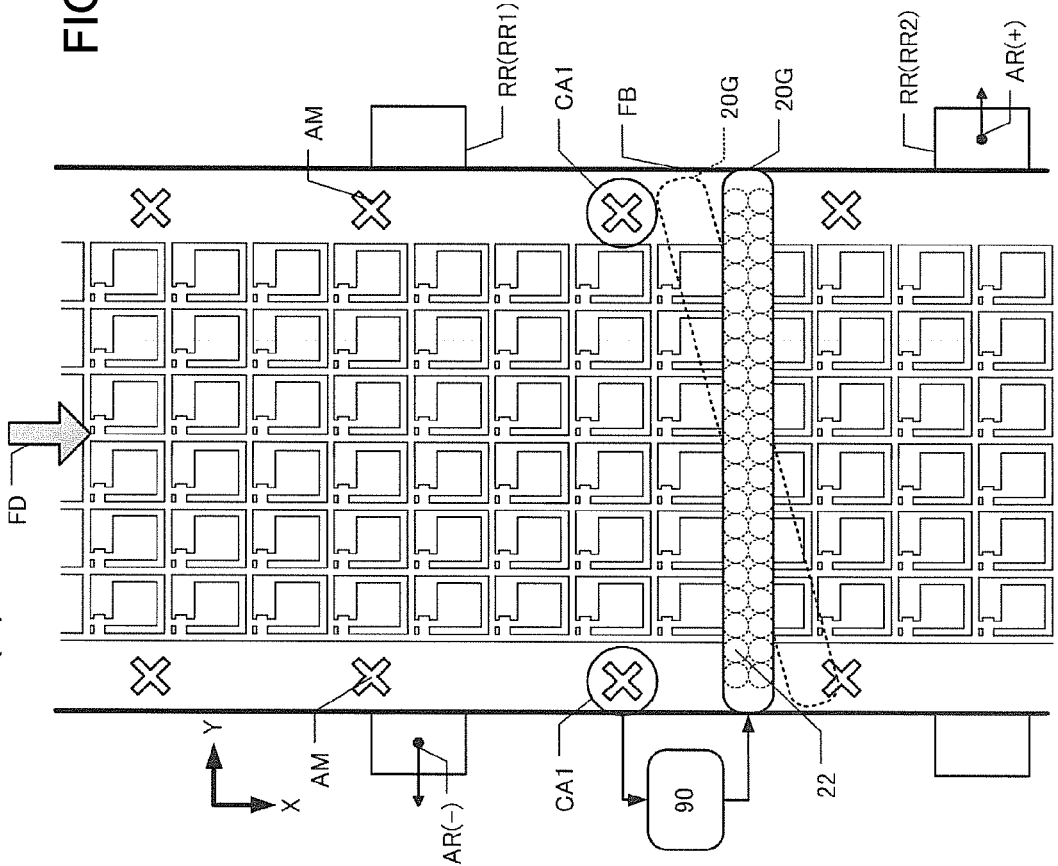

FIG. 6(a) is a view of the fabrication apparatus 100 for organic EL devices in the electrode formation step 92 observed from the upper side and the sheet substrate FB is fed in a feeding direction FD. Alignment marks AM are formed in both sides of the sheet substrate FB in the Y-axial direction, which is the width direction. As shown in FIG. 2, the mold 11 for fine imprinting of the imprint roller 10 forms a predetermined partition wall pattern in the center part of the sheet substrate FB and simultaneously forms the alignment marks AM in both ends in the width direction (Y-direction) of the sheet substrate FB. A pair of the alignment cameras CA1 are installed in end parts of the sheet substrate FB in the Y-direction and the pair of the alignment cameras CA1 take the alignment marks AM. The image taking results are transmitted to the speed and alignment control unit 90.

The droplet applicator 20G for gates is arranged in the Y-axial direction as shown in FIG. 6(a) and a large number of nozzles 22 are arranged along the Y-axial direction. Further, the nozzles 22 are installed in a plurality of lines in the X-axial direction. In FIG. 6(a), a large number of nozzles 22 arranged in the Y-axial direction are installed in two stages in the X-axial direction. The droplet applicator 20G for gates switches the timing of application of metal ink from a nozzle 22 to the timing of application of metal ink from a nozzle 22 corresponding to the positioning signals transmitted from the speed and alignment control unit 90.

The mold 11 for fine imprinting shown in FIG. 2 defines the positional relation of the alignment mark AM and the gate bus line GBL and the source bus line SBL of a field effect type transistor. That is, as shown in FIG. 6(b), a predetermined distance PY of the alignment mark AM and the gate bus line GBL is defined in the Y-axial direction and a predetermined distance PX of the alignment mark AM and the source bus line SBL is defined in the X-axial direction. Further, the feeding speed of the sheet substrate FB is detected.

Accordingly, the speed and alignment control unit 90 detects the shift and the θ rotation of the sheet substrate FB from the X-axial direction and Y-axial direction and by taking images of pairs of the alignment marks AM. In FIG. 6(a), although a pair of alignment marks AM is formed for the partition walls BA of several field effect type transistors in the X-axial direction, a pair of alignment marks can be formed for partition walls BA of field effect type transistors in one line. Further, if the space is available, the alignment marks can be formed not only in both sides of the sheet substrate but also in the center region.

Although a pair of alignment marks AM are shown to be a cross shape, the shape can be a circular mark, a slanting straight line, or other marks.

In the case where the speed and alignment control unit 90 detects the shift of the sheet substrate FB in the Y-axial direction, the control unit 90 moves the rollers RR arranged back and forth in the X-axial direction (named as an upper roller RR1 in the upstream side and a downstream roller RR2 in the downstream side) same toward the Y-axial direction. Consequently, due to the frictional force between the sheet substrate FB and both of the upper roller RR1 and the downstream roller RR2, the sheet substrate FB is moved in the Y-axial direction. Accordingly, the shift of the sheet substrate FB can be solved.

Further, in the case the speed and alignment control unit 90 detects the θ rotation shift of the sheet substrate FB, the control unit 90 moves the upper roller RR1 in the direction AR (−) shown as the arrow and the downstream roller RR2 in the in the direction AR (+) shown as the arrow while the sheet substrate FB is being fed in the X-axial direction. Consequently, due to the frictional force between the sheet substrate FB and both of the upper roller RR1 and the downstream roller RR2, the sheet substrate FB is drawn toward the −Y-axial direction in the upstream side and toward the +Y-axial direction in the downstream side. Accordingly, due to the opposed movement of the upper roller RR1 and the downstream roller RR2 in the Y-axial direction, the sheet substrate FB can be rotated by θ rotation. As a result, movement of the upper roller RR1 and the downstream roller RR2 can solve the θ rotation of the sheet substrate FB.

Furthermore, the θ rotation shift of the sheet substrate FB can be solved by rotating the droplet applicator 20G for gates on a Z-axial direction as a rotation center. In FIG. 6(a), the state that the droplet applicator 20G for gates is rotated on the Z-axial direction as a rotation center is shown by the dotted line. In the case where the sheet substrate FB is rotated by on the θ rotation, the droplet applicator 20G for gates is rotated to be perpendicular to the feeding direction of the sheet substrate FB and thus the application position of the metal ink can be corrected. Further, since a large number of nozzles 22 are arranged in two stages in the X-axial direction in the droplet applicator 20G for gate, in the case where the θ rotation shift is slight, the timing of the metal ink application can be adjusted corresponding to the θ rotation shift of the sheet substrate FB, so that it can be possible to solve the θ rotation shift of the sheet substrate FB.

An operation of a fabrication apparatus of organic EL device will now be described.

Figure 7:
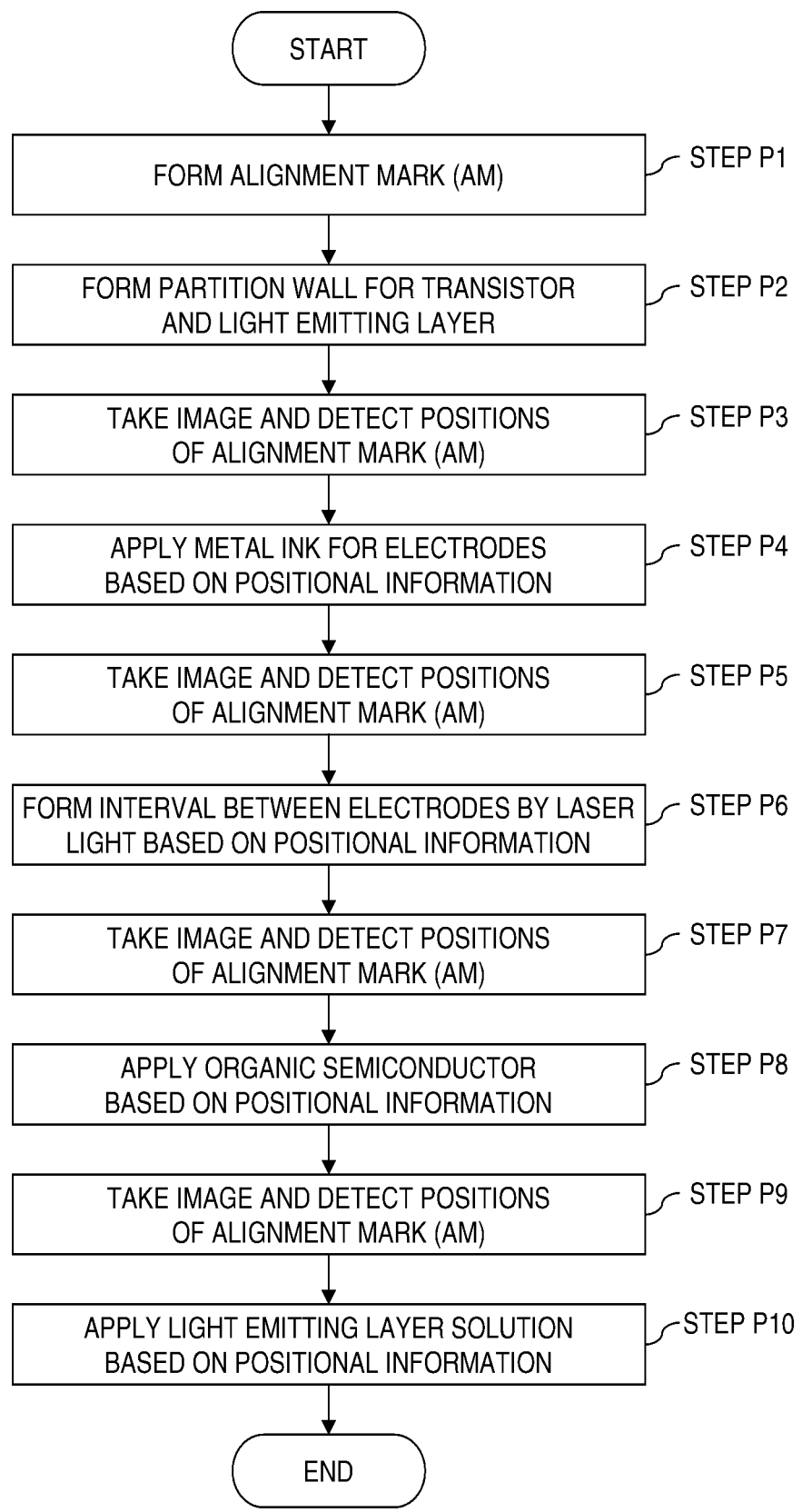
FIG. 7 is a schematic flow chart of a fabrication process of the organic EL device 50.

FIG. 7 is a schematic flow chart of mainly the alignment means in the fabrication process of the organic EL device 50.

In a step P1, alignment marks are formed in the sheet substrate FB by the imprint roller 10.

In a step P2, partition walls BA for a thin film transistor and light emitting layer are formed in the sheet substrate FB by the heat transfer by the imprint roller 10. The alignment marks AM and the partition walls BA are simultaneously formed since the mutual positional relation is important.

In a step P3, the alignment cameras CA1 to CA3 take the alignment marks AM and the speed and alignment control unit 90 detects the position of the sheet substrate FB.

Next, in a step P4, the droplet applicator 20G or the like applies the metal ink for respective kind electrodes and insulation based on the detected position data.

In a step 5, the alignment camera CA4 takes the alignment mark AM and the speed and alignment control unit 90 detects the position of the sheet substrate FB.

Next, in a step P6, based on the detected information data, based on the detected position data, laser light LL forms the interval of the source electrode S and drain electrode D.

In a step P7, the alignment camera CA5 takes the alignment mark AM and the speed and alignment control unit 90 detects the position of the sheet substrate FB.

Next, in a step P8, based on the detected position data, droplet applicator 200S for organic semiconductors forms the organic semiconductor in the interval of the source electrode S and drain electrode D.

In a step P9, the alignment camera CA6 takes the alignment mark AM and the speed and alignment control unit 90 detects the position of the sheet substrate FB.

Next, in a step P10, based on the detected position data, the light emitting layer is formed. Hereinafter, the insulating layer I and ITO electrode are formed in the same manner.

Figure 8:
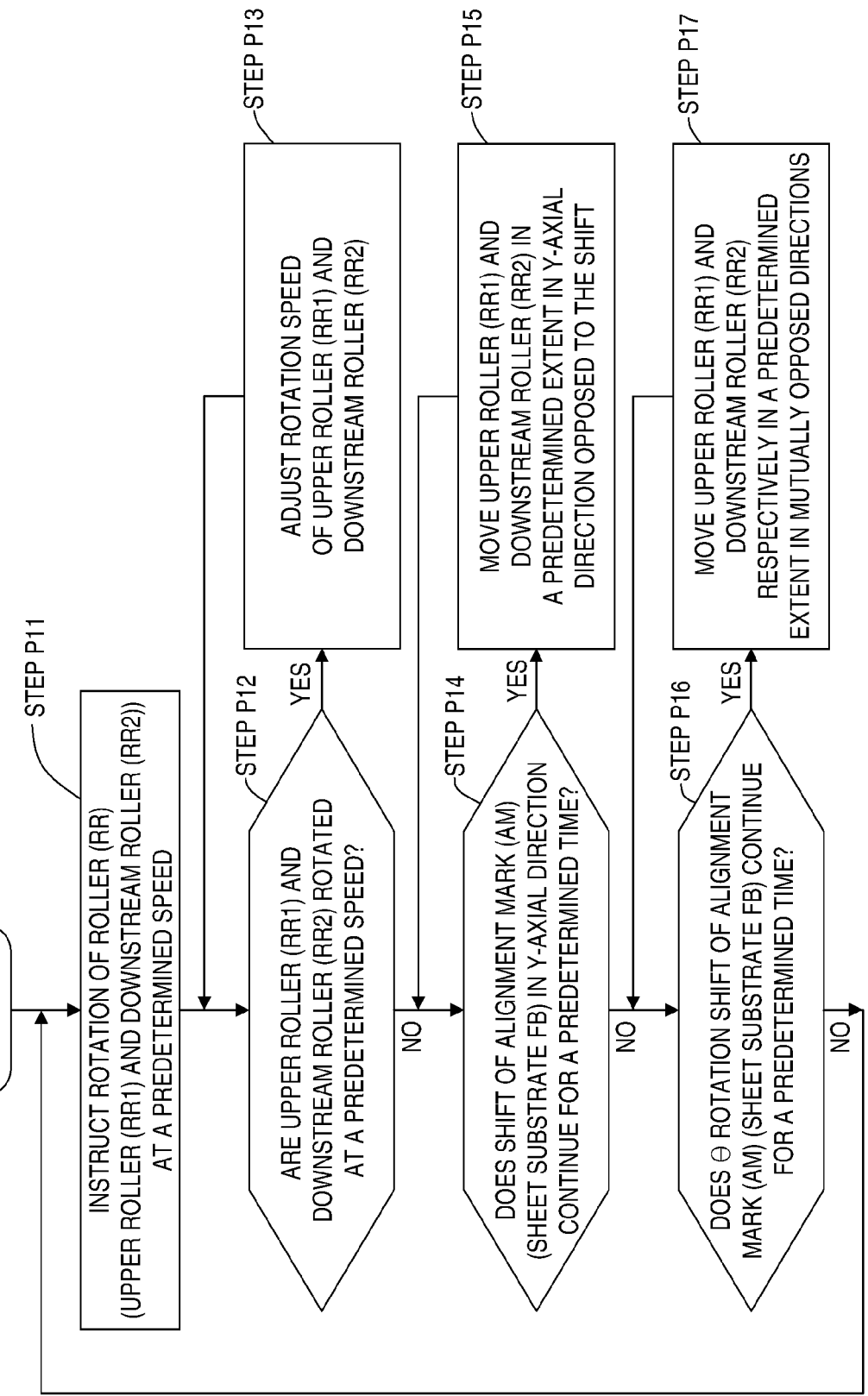
FIG. 8 is a schematic flow chart of an operation of a roller RR.

FIG. 8 is an operation flow chart of rollers RR. The operation of the rollers RR can be applied at any point from the partition wall formation step 91 to the light emitting layer formation step 93, and it will be described particularly with reference to the electrode formation step 92 shown in FIG. 6(a).

In a step P11, the speed and alignment control unit 90 outputs instructions to the rollers RR (upper roller RR1 and downstream roller RR2) to rotate at a predetermined rotation speed.

In a step P12, based on the interval of the taken image of the alignment marks AM detected by the alignment camera CA, the feeding speed of the sheet substrate FB is detected. Further, whether or not the upper roller RR1 and the downstream roller RR2 are rotated at a predetermined speed is confirmed. If the upper roller RR1 and the downstream roller RR2 are rotated at the predetermined speed, the process proceeds to a step P14 and if the upper roller RR1 and the downstream roller RR2 are not rotated at the predetermined speed, the process proceeds to a step P13.

In the step P13, the speed and alignment control unit 90 outputs instructions of the adjustment of the rotation speed of the upper roller RR1 and the downstream roller RR2 to carry out feedback control.

In the step P14, whether the sheet substrate FB is shifted in the Y-axial direction for a predetermined time or not is confirmed based on the position of the alignment mark AM in the Y-axial direction detected by the alignment camera CA. If it is a short time, a proper nozzle 22 is used among a plurality of nozzles 22 (see FIG. 6(a)) of the droplet applicator 20 and applies ink, or the like, to deal with the problem. However, if the shift of the sheet substrate FB in the Y-axial direction is continued, the positioning correction of the sheet substrate FB in the Y-axial direction is carried out by moving the rollers RR. If the sheet substrate FB is shifted in the Y-axial direction, the process proceeds to a step P15 and if the sheet substrate FB is not shifted, the process proceeds to a step P16.

In the step P15, the speed and alignment control unit 90 moves the upper roller RR1 and the downstream roller RR2 toward the opposed direction to the extent corresponding to the shift degree of the sheet substrate FB in the Y-axial direction.

In the step P16, whether the sheet substrate FB is shifted by θ rotation for a predetermined time or not is confirmed based on the position of the alignment mark AM in the X-axial direction and Y-axial direction detected by the alignment camera CA. If it is a short time, a proper nozzle 22 is used among a plurality of nozzles 22 of the droplet applicator 20 and applies ink, or the like, to deal with the problem. However, if the θ rotation shift of the sheet substrate FB is continued, the upper roller RR1 is shifted, for example, toward the −Y-axial direction and the downstream roller RR2 is shifted toward in the +Y-axial direction to rotate the sheet substrate FB by the θ rotation. If the sheet substrate FB is shifted by the θ rotation, the process proceeds to a step P17 and if the sheet substrate FB is not shifted, the speed adjustment of the upper roller RR1 and the downstream roller RR2 is continued.

In the step P17, the speed and alignment control unit 90 moves the upper roller RR1 and the downstream roller RR2 toward the mutually opposed directions to the extent corresponding to the shift degree.

Figure 9:
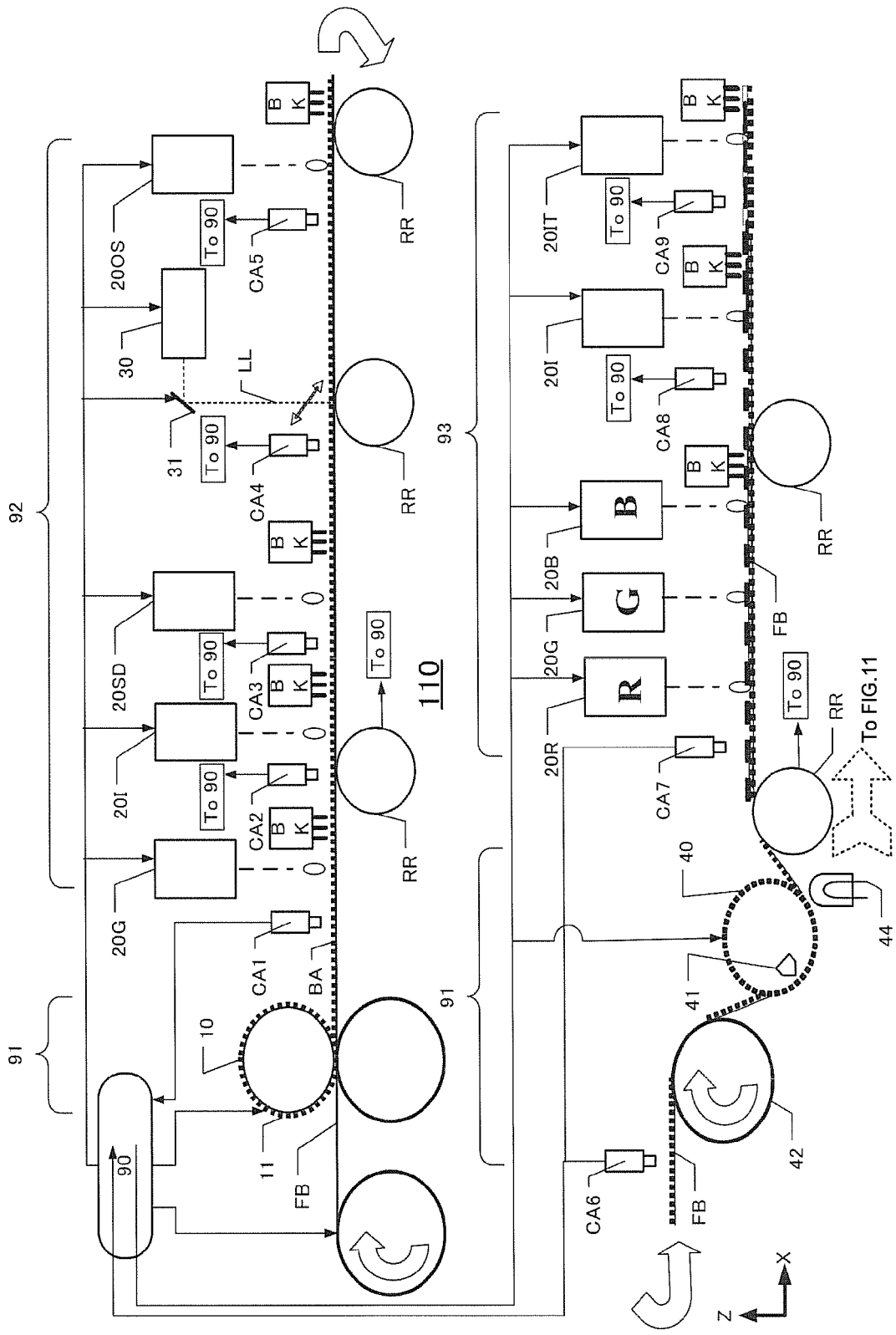
FIG. 9 is a schematic view showing another configuration of a fabrication apparatus 110 for fabricating an organic EL device having a pixel electrode, a light emitting layer, and the like in a flexible substrate.

FIG. 9 is a schematic view showing another exemplary configuration of a fabrication apparatus 110 for fabricating the organic EL device having the pixel electrode, the light emitting layer, and the like, in the flexible substrate and shows an another example of the fabrication apparatus shown in FIG. 2. The same symbols are assigned for the parts and apparatus having the same functions in the fabrication apparatus 100.

The fabrication apparatus 110 shown in FIG. 9 differs from the fabrication apparatus 100 in terms that it comprises two points for the partition wall formation step 91. An upstream imprint roller 10 forms partition wall BA for wiring of a thin film transistor and forms alignment marks AM in both sides of the strip-shaped flexible sheet substrate FB in the Y-axial direction, which is the width direction. Further, in a downstream partition wall formation step 91, a printing roller 40 is used.

The printing roller 40 has a metal mask on the surface to carry out screen printing. Further, the printing roller 40 contains an ultraviolet curable resin in the inside. The ultraviolet curable resin is applied to the sheet substrate FB through the metal mask by a squeegee 41. Accordingly, the partition wall BA of the ultraviolet curable resin can be formed. The height of the partition wall BA is 10 and several μm or lower. The partition wall BA of the ultraviolet curable resin formed in the sheet substrate FB are cured by an ultraviolet lamp 44 such as a mercury lamp.

In the case of forming a light emitting layer, a hole transportation layer, and an electron transportation layer in the organic EL device, the height of the partition wall BA is required to be high. It is impossible for the thermal transfer by the imprint roller 10 to make the partition wall BA so high in the case where the partition wall BA is projected from the sheet substrate FB. Therefore, the printing roller 40 is installed besides the imprint roller 10.

The alignment camera CA6 is installed upstream of the printing roller 40 and the speed and alignment control unit 90 detects the position of the sheet substrate FB before the printing roller 40. The speed and alignment control unit 90 controls the rotation control of the printing roller 40 to print the ultraviolet curable resin corresponding to the position of a thin film transistor formed in the sheet substrate FB.

The ultraviolet curable resin layer means a layer containing a resin curable by ultraviolet radiation via cross-liking reaction as a main component. Preferable to be used as the ultraviolet curable resin are those that contain monomer components having an ethylenic unsaturated double bond and are cured by ultraviolet radiation to form the ultraviolet curable resin layer. Preferable examples of the ultraviolet curable resin can be an ultraviolet curable urethane acrylate-based resin, ultraviolet curable polyester acrylate-based resin, ultraviolet curable epoxy acrylate-based resin, ultraviolet curable polyol acrylate-based resin, or ultraviolet curable epoxy resins. Among them, is preferably ultraviolet curable acrylate-based resin. In addition, if the partition wall BA for the light emitting layer, a black matrix is preferable. Therefore, metals such as chromium or oxides can be introduced into the ultraviolet curable acrylate-based resin.

The partition wall BA of the ultraviolet curable resin can be formed on the partition wall BA formed in the sheet substrate by the imprint roller 10 or can be formed in a region where no partition wall BA is formed the imprint roller 10. The light emitting layer formation step 93 downstream of the printing roller 40 can be sufficient to be the same configuration as that explained in Embodiment 1.

In addition, the arrow with remark "continued to FIG. 11" is described between the partition wall formation step 91 by the printing roller 40 and the light emitting layer formation step 93, and it will be described in Embodiment 3.

Alignment in the Y-axial direction using printing roller is described below.

As described with reference to FIG. 6(a) to FIG. 8, based on the positions of the alignment mark AM in X-axial and Y-axial directions detected by the alignment camera CA, the droplet applicator 20 switches nozzles 22 to correct the position of ink application to the sheet substrate FB. The position of the printing roller 40 is changed as described below.

Figure 10:
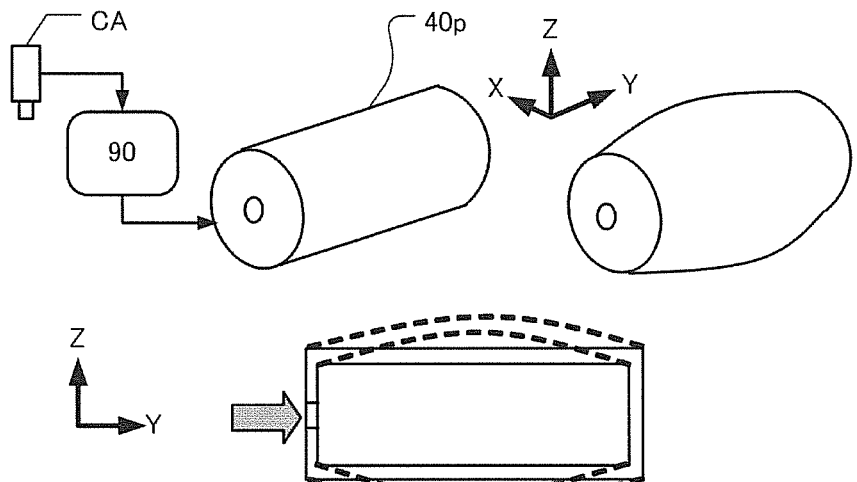
FIGS. 10(a)-10(c) are explanatory drawings explaining a mechanism for alignment in a Y-axial direction by a printing roller 40, where
Figure 10:
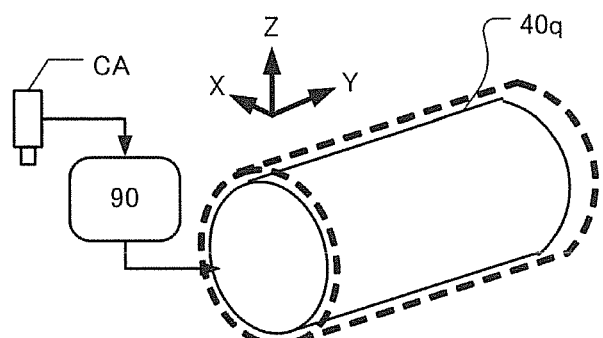
Figure 10:
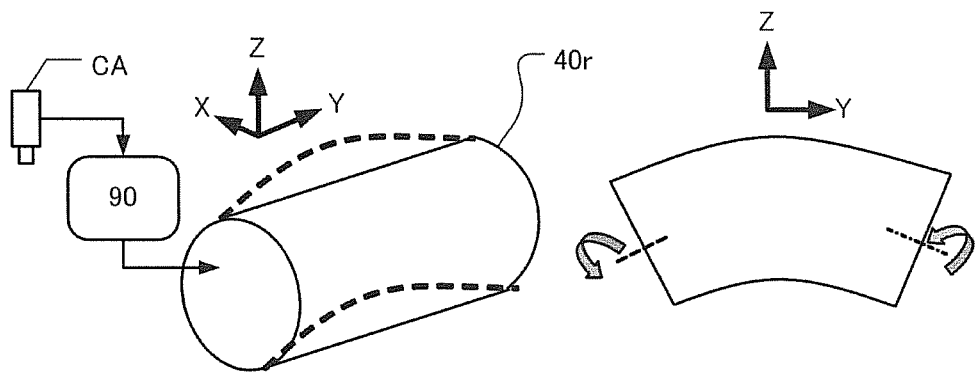

FIGS. 10(a)-(c) are explanatory drawings illustrating the mechanism for alignment in the Y-axial direction by the printing roller 40. The metal mask is formed in the surface of the printing roller. Based on the signals from the speed and alignment control unit 90, the positioning in the X-axial direction can be adjusted by rotation speed of the printing roller. The positioning in the Y-axial direction can be carried out by the following method.

FIG. 10(a) shows a printing roller 40p in which the roller center is expanded or dented in a pneumatic or hydraulic control manner. Air or oil is supplied according to the signals from the speed and alignment control unit 90 to change the positions of the roller center part and the peripheral parts in the Y-axial direction.

FIG. 10(b) shows a printing roller 40q that is expanded or contracted as a whole in a thermal deformation control manner. Being heated or cooled according to the signals from the speed and alignment control unit 90, the positions of the entire body of the roller can be changed in the Y-axial direction and in the X-axial direction.

FIG. 10(c) shows a printing roller 40r that is curved as a whole in a bending deformation control manner. It is preferable for the printing roller 40r to have slits formed in the circumferential direction in order to bend the printing roller with slight power.

Embodiment 3

Fabrication Apparatus of Liquid Crystal Display Device

Next, a fabrication apparatus and a fabrication method of a liquid crystal display device will be described. A liquid crystal display device generally comprises a deflecting filter, a sheet substrate FB having a thin film transistor, a liquid crystal layer, a color filter, and a deflecting filter. It is explained that the sheet substrate FB having a thin film transistor among them can be formed by the fabrication apparatus 100 shown in the upper side of FIG. 2 and the fabrication apparatus 110 shown in the upper side of FIG. 9.

In Embodiment 3, supply of the liquid crystal and sticking of a color filter CF will be described.

It is generally required to supply a liquid crystal to the liquid crystal display device and also to form sealing wall for the liquid crystal. Therefore, the printing roller 40 for the partition wall formation step 91 drawn in the lower side of FIG. 9 is employed for sealing wall of the liquid crystal but not for the partition wall BA for the light emitting layer in Embodiment 3.

Figure 11:
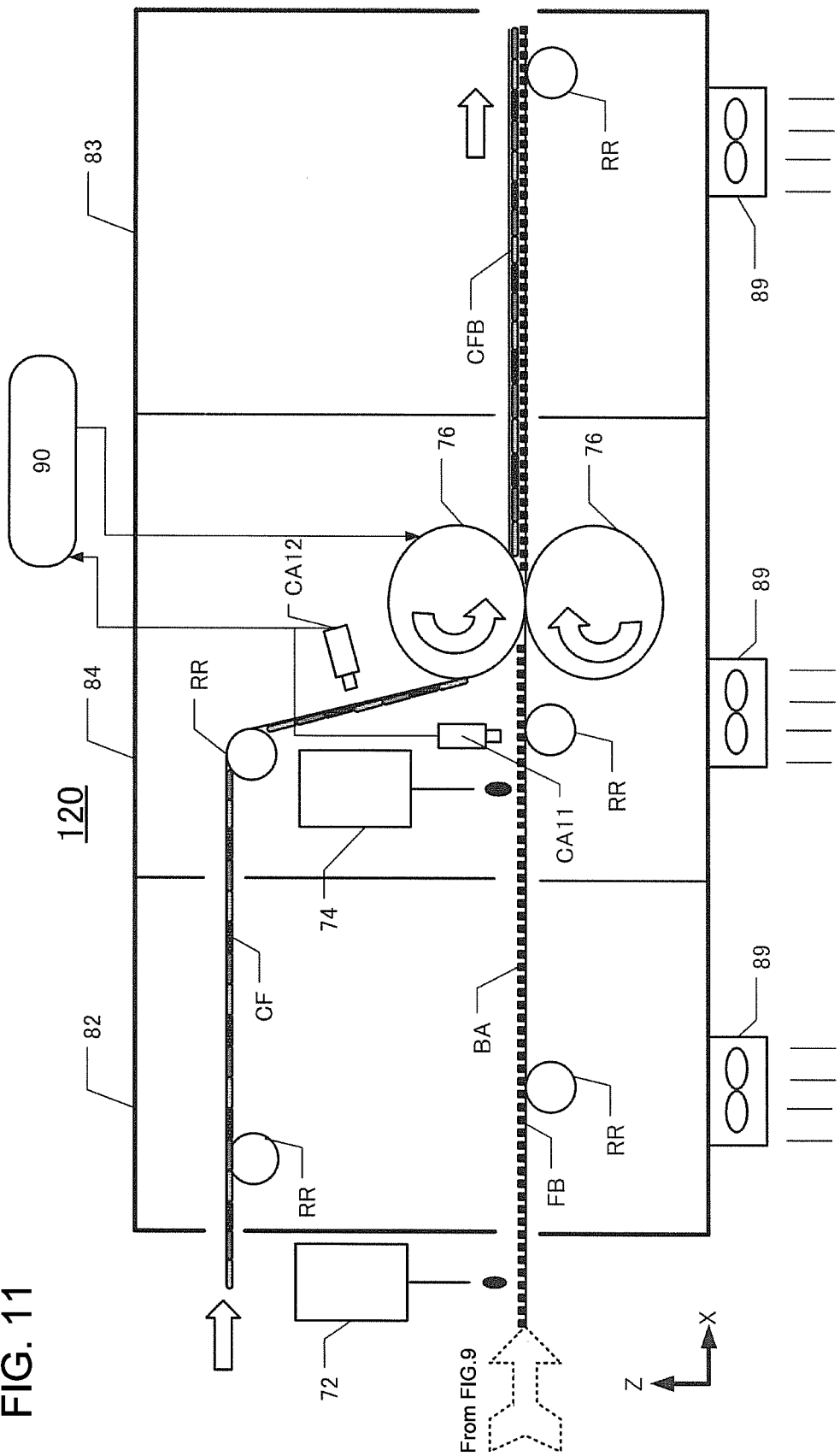
FIG. 11 shows a liquid crystal supply and color filter-sticking apparatus 120.

FIG. 11 shows a liquid crystal supply and color filter-sticking apparatus 120. The liquid crystal supply and color filter-sticking apparatus 120 is provided with an upstream side low vacuum chamber 82 and a downstream side low vacuum chamber 83 and a high vacuum chamber 84 is formed between the upstream side low vacuum chamber 82 and the downstream side low vacuum chamber 83. These low vacuum chambers 82 and 83 and the high vacuum chamber 84 are vacuum-evacuated by a rotary pump or a turbo molecular pump 89.

A color filter CF is to be supplied from an upper stage to the upstream side low vacuum chamber 82 and a sheet substrate FB in which sealing walls for liquid crystals are formed by the printing roller 40 shown in FIG. 9 is also supplied. In addition, no light emitting layer IR and transparent electrode ITO are formed in the sheet substrate FB. That is, the sheet substrate in the arrow part remarked as "continued to FIG. 11" is continued to the sheet substrate FB in the arrow part remarked as "from FIG. 9" shown in FIG. 11. Further, alignment marks are formed in both sides of the color filter CF in the Y-axial direction.

At first, a thermosetting adhesive for sticking the color filter CF is applied to the sheet substrate FB bearing the sealing wall for liquid crystals by an adhesive dispenser 72. The sheet substrate FB is sent to the high vacuum chamber 84 via the upstream side low vacuum chamber 82. In the high vacuum chamber 84, a liquid crystal is applied from a liquid crystal dispenser 74. Thereafter, the color filter CF and the sheet substrate FB are stuck by a heat transfer roller 76.

The alignment camera CA 11 takes an image of the alignment marks AM of the sheet substrate FB and the alignment camera CA 12 takes an image of the alignment marks AM of the color filter CF. The results of taking image by the alignment cameras CA11 and CA12 are transmitted to the speed and alignment control unit 90 to detect shift in the X-axial direction, shift in the Y-axial direction, and θ rotation. Corresponding to the positioning signals sent from the speed and alignment control unit 90, the heat transfer roller 76 changes the rotation speed and sticks the color filter CF and the sheet substrate FB while positioning them.

The stuck liquid crystal display device sheet CFB is sent to outside via the downstream side low vacuum chamber 83.

Although the thermosetting adhesive is used as the adhesive in this explanation, an ultraviolet curable adhesive can be used. In this case, an ultraviolet lamp or the like can be used in place of the heat transfer roll 76.

The fabrication methods for organic EL devices and liquid crystal display devices are described and the fabrication apparatus of the present invention can be applied for a field emission display.

Further, the heat treater BA is installed in the fabrication apparatus in the exemplary embodiments described; however, metal ink or light emitting layer solutions which do not require heat treatment by improvement of the ink or solutions have been proposed. Therefore, in the embodiments, it is not necessarily required to install the heat treater BA.

Furthermore, although the imprint roller 10 is installed at first in FIG. 2 or FIG. 9, the partition wall BA can be formed by the printing roller 40 in place of the imprint roller 10.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention can be practiced otherwise than as specifically described herein.

What is claimed is:

1. A method for fabricating a display device, which has a plurality of pixels, on a flexible sheet-like substrate transferred in a first direction, said method comprising:
preparing an imprint roller having a surface with a stumper of partition walls for forming the plurality of pixels and for forming a bus line between electrodes of transistors provided at the plurality of respective pixels and the plurality of pixels, and a stumper of alignment marks being located at a predetermined position with respect to the plurality of pixels;
forming the partition walls for forming the plurality of pixels and for forming the electrodes of the transistors and the bus line, and forming the alignment marks simultaneously on the flexible substrate along the first direction by pressing the flexible sheet-like substrate against the imprint roller while transferring the flexible sheet-like substrate in the first direction;
detecting the alignment marks formed on the flexible substrate and obtaining a positional information of the alignment marks;
a first applying step of, based on the positional information, selectively applying a liquid conductive material between parts of the partition walls for forming the electrodes and the bus line using a first applicator so as to form the electrodes and the bus line; and
a second applying step of, after the first applying step, detecting the alignment marks formed on the flexible sheet-like substrate and, based on positional information of the alignment marks, applying a liquid insulating material or a liquid semiconductor material onto a part of the electrodes or the bus line formed between the partition walls using a second applicator in a selective manner that depends on positions of the transistors.

2. The method according to claim 1, wherein the first applicator comprises a roller unit including the conductive material in a circumferential surface and the roller unit is positioned against the partition walls formed on the flexible substrate in a second direction crossing the first direction due to deformation of the circumferential surface, and is used to apply the conductive material to the partition walls.

3. The method according to claim 1, wherein the first applicator comprises a droplet application unit for applying droplets of the liquid of the conductive material and the droplet application unit is positioned over the partition walls formed on the flexible substrate in a second direction crossing the first direction by changing the application position of the droplets, and is used to apply the conductive material between the partition walls.

4. The method according to claim 2, wherein the alignment marks are formed in both ends of the flexible substrate in the second direction.

5. The method according to claim 1, wherein the first and second applicators are positioned over the partition walls formed in the flexible substrate in the first direction based on the feeding speed of the flexible substrate in the first direction and the positional information of the alignment marks.

6. The method according to claim 1, further comprising cutting a portion of the electrode formed by the conductive material in the first applying step.

7. The method according to claim 1, wherein the flexible substrate is fed in the first direction continuously from a strip-shaped continuous substrate rolled into a roll.

8. The method according to claim 1, wherein the partition walls of the pixels are in a center part of the flexible substrate, wherein the alignment marks are formed in both ends of the flexible substrate in a width direction of the flexible substrate, and wherein the width direction is perpendicular to the first direction.

9. The method according to claim 1, wherein the alignment marks are formed in both ends of the flexible substrate in a second direction crossing the first direction, and wherein the alignment marks are formed along the first direction at predetermined intervals.

10. The method according to claim 9, wherein the first applicator comprises a plurality of nozzles through which a droplet of the liquid conductive material is discharged, and the second applicator comprises a plurality of nozzles through which a droplet of the liquid insulating material or the liquid semiconductor material is discharged, and wherein the first applying step or the second applying step comprises calculating an expansion and/or a contraction of the flexible sheet-like substrate based on the positional information of the alignment marks, and switching the nozzles of the first applicator or the second applicator depending on the expansion and/or the contraction or changing timing at which the droplet is discharged.

11. The method according to claim 9, further comprising detecting the alignment marks formed on both ends in the second direction of the flexible sheet-like substrate at predetermined intervals in the first direction so as to detect, as the positional information, a shift of the flexible sheet-like substrate in the second direction and a rotational shift of the flexible sheet-like substrate.

12. The method according to claim 11, wherein the first applicator comprises a plurality of nozzles through which a droplet of the liquid conductive material is discharged, and the second applicator comprises a plurality of nozzles through which a droplet of the liquid insulating material or the liquid semiconductor material is discharged, and wherein the first applying step or the second applying step comprises selecting, based on a degree of the shift in the second direction, a degree of the rotational shift, or a period of time for which the shift lasts, between control of moving the flexible sheet-like substrate so as to correct the shift in the second direction or the rotational shift and control of switching the nozzles or changing timing at which the droplet is discharged.

* * * * *